(12) United States Patent
Liu et al.

(10) Patent No.: US 11,310,904 B2
(45) Date of Patent: Apr. 19, 2022

(54) CHIP PACKAGE AND POWER MODULE

(71) Applicant: XINTEC INC., Taoyuan (TW)

(72) Inventors: Tsang-Yu Liu, Zhubei (TW); Po-Han Lee, Taipei (TW); Wei-Ming Chien, Taoyuan (TW)

(73) Assignee: XINTEC INC., Taoyuan (TW)

( * ) Notice: Subject to any disclaimer, the term of this patent is extended or adjusted under 35 U.S.C. 154(b) by 154 days.

(21) Appl. No.: 16/663,366

(22) Filed: Oct. 25, 2019

(65) Prior Publication Data

US 2020/0137879 A1 Apr. 30, 2020

Related U.S. Application Data

(60) Provisional application No. 62/752,916, filed on Oct. 30, 2018.

(51) Int. Cl.
*H05K 1/02* (2006.01)
*H05K 1/03* (2006.01)
*H01L 23/00* (2006.01)

(52) U.S. Cl.
CPC ........... *H05K 1/0215* (2013.01); *H01L 24/29* (2013.01); *H05K 1/0346* (2013.01); *H01L 2224/29139* (2013.01)

(58) Field of Classification Search
None
See application file for complete search history.

(56) References Cited

U.S. PATENT DOCUMENTS

| | | | | |
|---|---|---|---|---|
| 6,639,155 B1* | 10/2003 | Bupp | ................ | H01L 23/49822 174/255 |
| 2002/0070437 A1 | 6/2002 | Heerman | | |
| 2002/0076919 A1* | 6/2002 | Peters | ..................... | H01L 23/50 438/637 |
| 2003/0132529 A1* | 7/2003 | Yeo | ..................... | H01L 23/3677 257/778 |
| 2005/0173807 A1* | 8/2005 | Zhu | ..................... | H01L 25/0657 257/777 |
| 2006/0109176 A1* | 5/2006 | Lee | .......................... | H05K 1/16 343/700 MS |
| 2011/0079892 A1 | 4/2011 | Tsai | | |
| 2013/0196470 A1 | 8/2013 | Tsai | | |

(Continued)

FOREIGN PATENT DOCUMENTS

| | | |
|---|---|---|
| CN | 1488169 | 4/2004 |
| CN | 102034796 | 4/2011 |

(Continued)

*Primary Examiner* — James Wu
*Assistant Examiner* — Christopher L Augustin
(74) *Attorney, Agent, or Firm* — Liu & Liu (57) ABSTRACT

A chip package includes a high voltage withstanding substrate and a device chip. The high voltage withstanding substrate has a main body, a functional layer, and a grounding layer. The main body has a top surface, a bottom surface opposite the top surface, a through hole through the top surface and the bottom surface, and a sidewall surrounding the through hole. The functional layer is located on the top surface. The grounding layer covers the bottom surface and the sidewall. The device chip is located on the functional layer, and has a grounding pad that faces the main body. The grounding pad is electrically connected to the grounding layer in the through hole.

14 Claims, 6 Drawing Sheets

(56) References Cited

U.S. PATENT DOCUMENTS

| | | | |
|---|---|---|---|
| 2014/0203387 A1 | 7/2014 | Suen | |
| 2015/0364418 A1* | 12/2015 | Leong | H01L 24/17 257/531 |
| 2018/0102470 A1* | 4/2018 | Das | H01L 39/2493 |
| 2018/0286797 A1* | 10/2018 | Goh | H01L 23/66 |
| 2020/0083167 A1* | 3/2020 | LaRoche | H01L 21/28581 |

FOREIGN PATENT DOCUMENTS

| | | |
|---|---|---|
| CN | 103943641 | 7/2014 |
| CN | 103972226 | 8/2014 |
| CN | 107424987 | 12/2017 |
| JP | 2001118981 | 4/2001 |
| JP | 2013211368 | 10/2013 |
| TW | 513794 | 12/2002 |

\* cited by examiner

| Width of bottom of through hole (μm) | 90 | 80 | 70 | 55 | 45 |
|---|---|---|---|---|---|
| Thickness of main body (μm) | 85 | 85 | 85 | 85 | 85 |
| Aspect ratio | 0.94 | 1.06 | 1.21 | 1.55 | 1.89 |

Fig. 6

CHIP PACKAGE AND POWER MODULE

RELATED APPLICATIONS

This application claims priority to U.S. provisional Application Ser. No. 62/752,916, filed Oct. 30, 2018, which is herein incorporated by reference.

BACKGROUND

Field of Invention

The present invention relates to a chip package and a power module having the chip package.

Description of Related Art

Generally speaking, a top surface of a chip package has a plurality of conductive pads. After the chip package is bonded to a printed circuit board, the conductive pad can be electrically connected to the printed circuit board by a wire bonding process. A portion of these conductive pads are associated with the grounding function of the chip package, and another portion is associated with the function of the chip package itself (e.g., power processing, fingerprint recognition, and image processing, etc.).

However, in order to reduce a resistance value, each grounding pad of the chip package is usually bonded to more than two conductive wires to electrically connect to a grounding region of the printed circuit board. As a result, not only the interference between the conductive wires is prone to occur, but also the material cost and manufacturing cost of the conductive wires cannot be reduced. In addition, due to the limited area of the chip package, placing the grounding pad on the top surface of the chip package is disadvantageous for miniaturization.

SUMMARY

An aspect of the present invention is to provide a chip package.

According to an embodiment of the present invention, a chip package includes a high voltage withstanding substrate and a device chip. The high voltage withstanding substrate has a main body, a functional layer, and a grounding layer. The main body has a top surface, a bottom surface opposite the top surface, a through hole through the top surface and the bottom surface, and a sidewall surrounding the through hole. The functional layer is located on the top surface. The grounding layer covers the bottom surface and the sidewall. The device chip is located on the functional layer, and has a grounding pad that faces the main body. The grounding pad is electrically connected to the grounding layer in the through hole.

In one embodiment of the present invention, the functional layer is made of a material including gallium nitride (the GaN).

In one embodiment of the present invention, the thickness of the functional layer is in a range from 3 μm to 4 μm.

In one embodiment of the present invention, the grounding layer substantially covers the entire bottom surface of the main body.

In one embodiment of the present invention, the region of the grounding layer is greater than the region of the grounding pad.

In one embodiment of the present invention, the grounding layer is made of a material including copper.

In one embodiment of the present invention, the device chip has a bottom surface that faces the functional layer, and the grounding pad is located on the bottom surface of the device chip.

In one embodiment of the present invention, the grounding pad is further located in the functional layer.

In one embodiment of the present invention, the device chip has a bottom surface that faces the functional layer, and the grounding pad is located in the bottom surface of the device chip.

In one embodiment of the present invention, the through hole and the grounding layer further extend into the functional layer.

In one embodiment of the present invention, the through hole and the grounding layer further extend into the device chip.

In an embodiment of the present invention, the device chip has a top surface facing away from the functional layer, and the top surface of the device chip has a conductive pad.

An aspect of the present invention is to provide a power module.

According to an embodiment of the present invention, a power module includes a printed circuit board and a chip package. The printed circuit board has a grounding region. The chip package is located on the grounding region of the printed circuit board. The chip package includes a high voltage withstanding substrate and a device chip. The high voltage withstanding substrate has a main body, a functional layer and a grounding layer. The main body has a top surface and a bottom surface opposite the top surface, a through hole through the top surface and the bottom surfaces, and a sidewall surrounding the through hole. The functional layer is located on the top surface. The grounding layer covers the bottom surface and the sidewall, and the grounding layer is located on the grounding region of the printed circuit board and is electrically connected to the grounding region. The device chip is located on the functional layer and has a grounding pad facing the main body. The grounding pad is electrically connected to the grounding layer in the through hole.

In an embodiment of the present invention, the printed circuit board has a wire bonding region. The device chip has a top surface facing away from the functional layer. The top surface of the device chip has a conductive pad. The power module further includes conductive wires. The two ends of the conductive wire are respectively located on the wire bonding region and the conductive pad.

In an embodiment of the present invention, a power module further includes bonding conductive layer. The bonding conductive layer is located between the grounding layer of the high voltage withstanding substrate and the grounding region of the printed circuit board.

In an embodiment of the present invention, the bonding conductive layer is silver paste or solder.

In the aforementioned embodiments of the present invention, since the grounding layer of the high voltage withstanding substrate covers the bottom surface of the main body and the sidewall that surrounds the through hole, and the grounding layer in the through hole is electrically connected to the grounding pad of the device chip on the functional layer, when the chip package is disposed on the grounding region of the printed circuit board, the grounding layer can be in contact with the grounding region of the printed circuit board to electrically connect to each other. As a result, the grounding pad of the device chip of the chip package can achieve the grounding effect through the grounding layer of the high voltage withstanding substrate and the grounding region of the printed circuit board, such that resistance value and noise can be reduced, and the grounding pad is not limited to the top surface of the device chip because the grounding pad does not need wire bonding, which can reduce the material cost and manufacturing cost of the conductive wire. In addition, the conductive pad associated with the function of the device chip can be disposed on the top surface of the device chip, and the conductive wire connected to the conductive pad is not interfered by the grounding pad of the device chip and the grounding layer of the high voltage withstanding substrate. Since the area of the chip package is limited, the grounding pad of the device chip and the grounding layer of the high voltage withstanding substrate of the present disclosure are advantageous for miniaturization.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
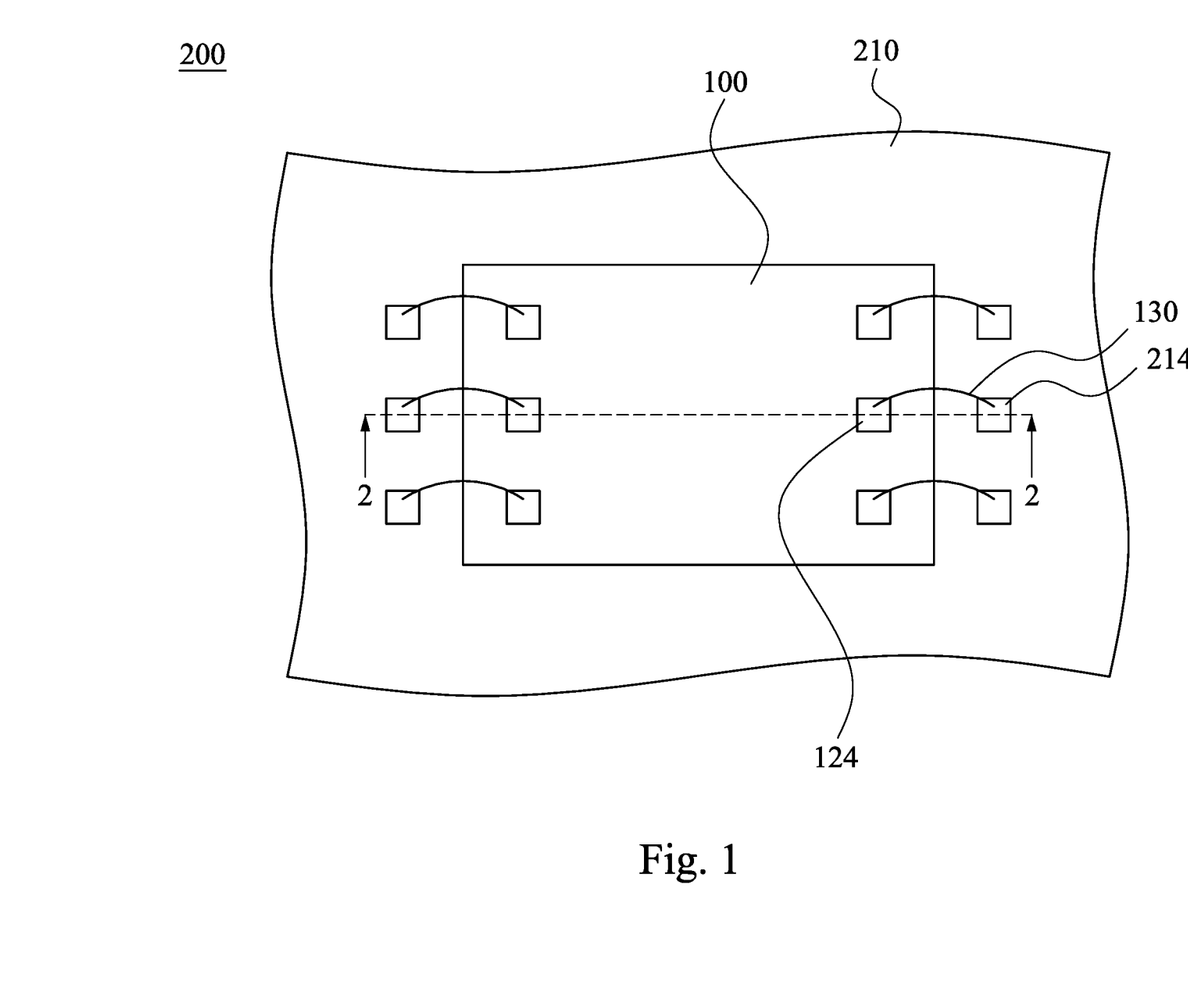
FIG. 1 is a top view of a power module according to one embodiment of the present invention.
Figure 2:
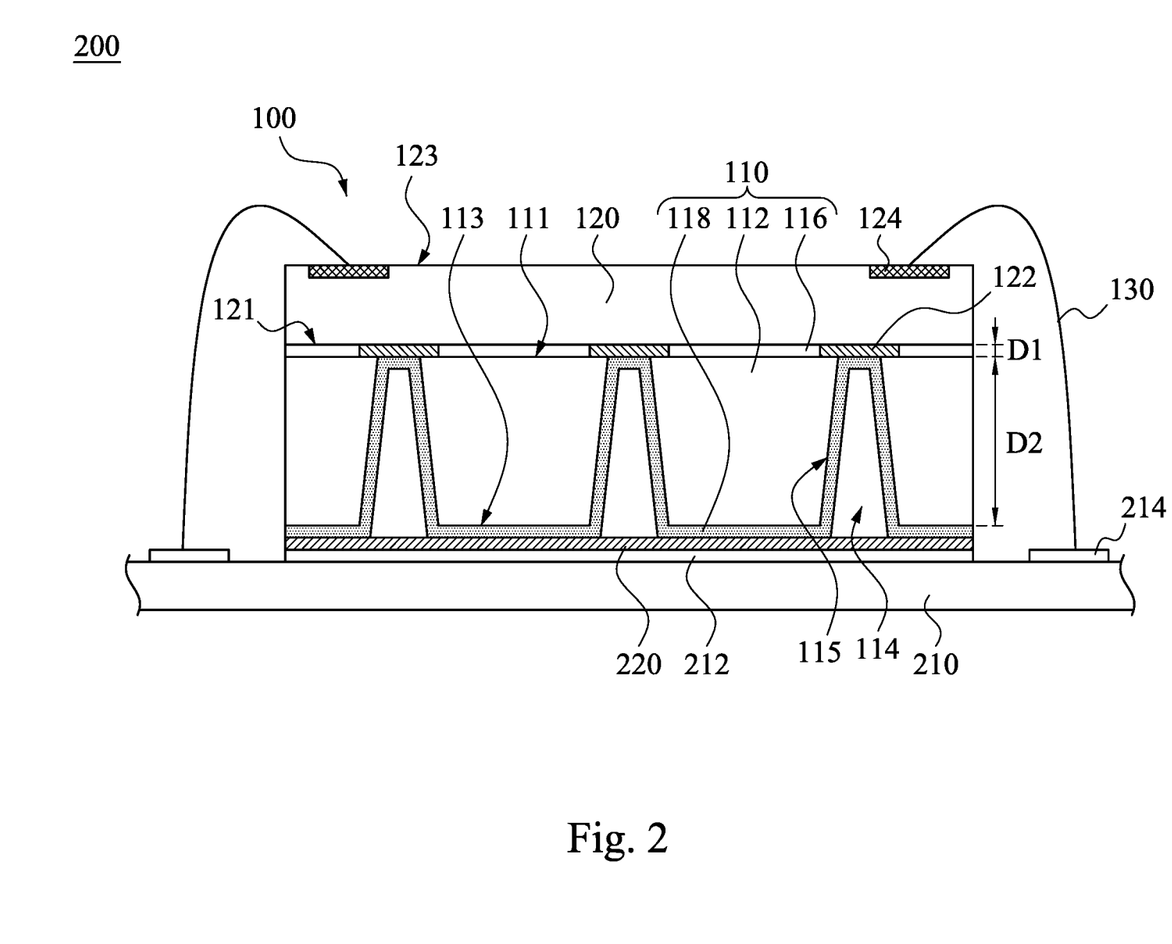
FIG. 2 is a cross-sectional view of the power module taken along line 2-2 shown in FIG. 1.

FIG. 1 is a top view of a power module 200 according to one embodiment of the present invention. FIG. 2 is a cross-sectional view of the power module 200 taken along line 2-2 shown in FIG. 1. As shown in FIG. 1 and FIG. 2, the power module 200 includes a printed circuit board 210 and a chip package 100. The printed circuit board 210 has a grounding region 212, and the grounding region 212 may be a conductive pad for grounding. The chip package 100 is located on the grounding region 212 of the printed circuit board 210. The grounding region 212 of the printed circuit board 210 may be a single large-area conductive structure or a plurality of small-area conductive structures, and the present invention is not limited in this regard. The chip package 100 includes a high voltage withstanding substrate 110 and a device chip 120. The high voltage withstanding substrate 110 has a main body 112, a functional layer 116, and a grounding layer 118. The main body 112 of high voltage withstanding substrate 110 has a top surface 111, a bottom surface 113 opposite the top surface 111, a through hole 114 through the top surface 111 and the bottom surface 113, and a sidewall 115 surrounding the through hole 114. The functional layer 116 is located on top surface 111. The grounding layer 118 covers the bottom surface 113 and the sidewall 115 surrounding the through hole 114, and the grounding layer 118 is located on the grounding region 212 of the printed circuit board 210 and is electrically connected to the grounding region 212. The device chip 120 is located on the functional layer 116, and has a grounding pad 122 facing the main body 112 of the high voltage withstanding substrate 110. The grounding pad 122 is electrically connected to the grounding layer 118 in the through hole 114. For example, the grounding pad 122 is in contact with the grounding layer 118.

In this embodiment, the high voltage withstanding substrate 110 may be a power component, but the present invention is not limited in this regard. The main body 112 of the high voltage withstanding substrate 110 is made of a material including silicon, and the functional layer 116 is made of a material including gallium nitride (GaN). As a result, the functional layer 116 enables the high voltage withstanding substrate 110 to have characteristics including high voltage withstanding, low leakage current, good performance at high frequency, etc. The functional layer 116 may be formed on the top surface 111 of the main body 112 by evaporation, in which a thickness D1 of the functional layer 116 may be in a range from 3 μm to 4 μm, and a thickness D2 of the main body 112 may be less than 4 mils. In addition, the grounding layer 118 is made of a material including copper, and may be formed on the bottom surface 113 of the main body 112 and the sidewall 115 that surrounds the through hole 114 by sputtering.

Since the grounding layer 118 of the high voltage withstanding substrate 110 covers the bottom surface 113 of the main body 112 and the sidewall 115 that surrounds the through hole 114, and the grounding layer 118 in the through hole 114 is electrically connected to the grounding pad 122 of the device chip 120 on the functional layer 116. When the chip package 100 is disposed on the grounding region 212 of the printed circuit board 210, the grounding layer 118 can be in contact with the grounding region 212 of the printed circuit board 210 to electrically connect to each other. As a result, the grounding pad 122 of the device chip 120 of the chip package 100 can achieve the grounding effect through the grounding layer 118 of the high voltage withstanding substrate 110 and the grounding region 212 of the printed circuit board 210, such that resistance value and noise can be reduced, and the grounding pad 122 is not limited to the top surface 123 of the device chip 120 because the grounding pad 122 does not need wire bonding, which can reduce the material cost and manufacturing cost of the conductive wire.

In this embodiment, the device chip 120 has a bottom surface 121 facing the functional layer 116. The grounding pad 122 is located on the bottom surface 121 of the device chip 120. Therefore, the grounding pad 122 can be located in the functional layer 116 of the high voltage withstanding substrate 110.

Furthermore, the device chip 120 has a top surface 123 facing away from the functional layer 116, and the top surface 123 of the device chip 120 has a conductive pad 124. The conductive pad 124 is associated with the function of the device chip 120, such as power processing, fingerprint recognition, and image processing, etc. The conductive pad 124 is not used for grounding. The printed circuit board 210 has a wire bonding region 214. The power module 200 further includes a conductive wire 130. Two ends of the conductive wire 130 are respectively located on the wire bonding region 214 and the conductive pad 124 to electrically connect the grounding region 214 and the conductive pad 124. The conductive wire 130 may be fixed on the wire bonding region 214 of the printed circuit board 210 and the conductive pad 124 of the device chip 120. The conductive wire 130 connected to the conductive pad 124 is not interfered by the grounding pad 122 of the device chip 120 and the grounding layer 118 of the high voltage withstanding substrate 110. Since the area of the chip package 100 is limited, the grounding pad 122 of the device chip 120 and the grounding layer 118 of the high voltage withstanding substrate 110 of the present disclosure are advantageous for miniaturization.

In this embodiment, the power module 200 further includes a bonding conductive layer 220. The bonding conductive layer 220 is located between the grounding layer 118 of the high voltage withstanding substrate 110 and the connection region 212 of the printed circuit board 210. The bonding conductive layer 220 may be silver paste or solder such that the grounding layer 118 is bonded to the landing region 212 and electrically connected to each other.

Figure 3:
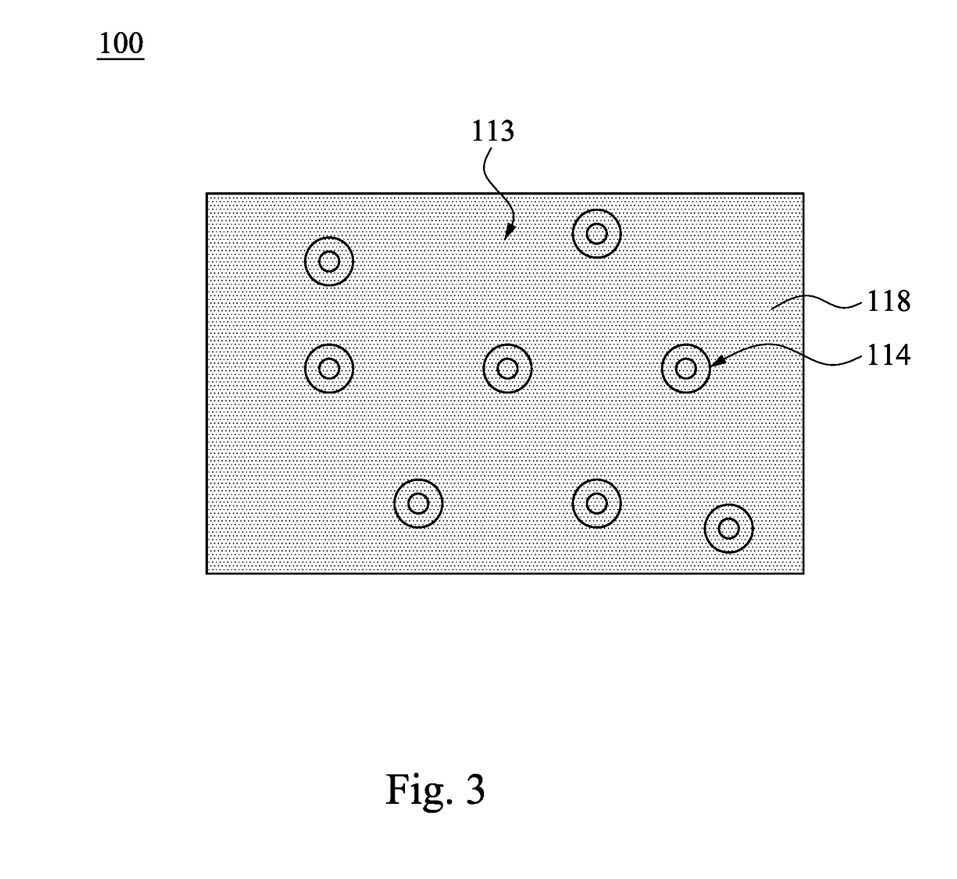
FIG. 3 is a bottom view of the chip package shown in FIG. 2.

FIG. 3 is a bottom view of the chip package 100 of FIG. 2. As shown in FIG. 2 and FIG. 3, the grounding layer 118 is made of a material including metal (e.g. copper), and can be referred to as a heat dissipation structure with a large area to enhance the thermal conductivity of the chip package 100. In this embodiment, the grounding layer 118 substantially covers the entire bottom surface 113 of the main body 112. Further, the area of the grounding layer 118 of the high voltage withstanding substrate 110 is greater than the area of the grounding pad 122 of the device chip 120.

It is to be noted that the connection relationships, materials, and advantages of the elements described above will not be repeated. In the following description, other types of chip packages will be described.

Figure 4:
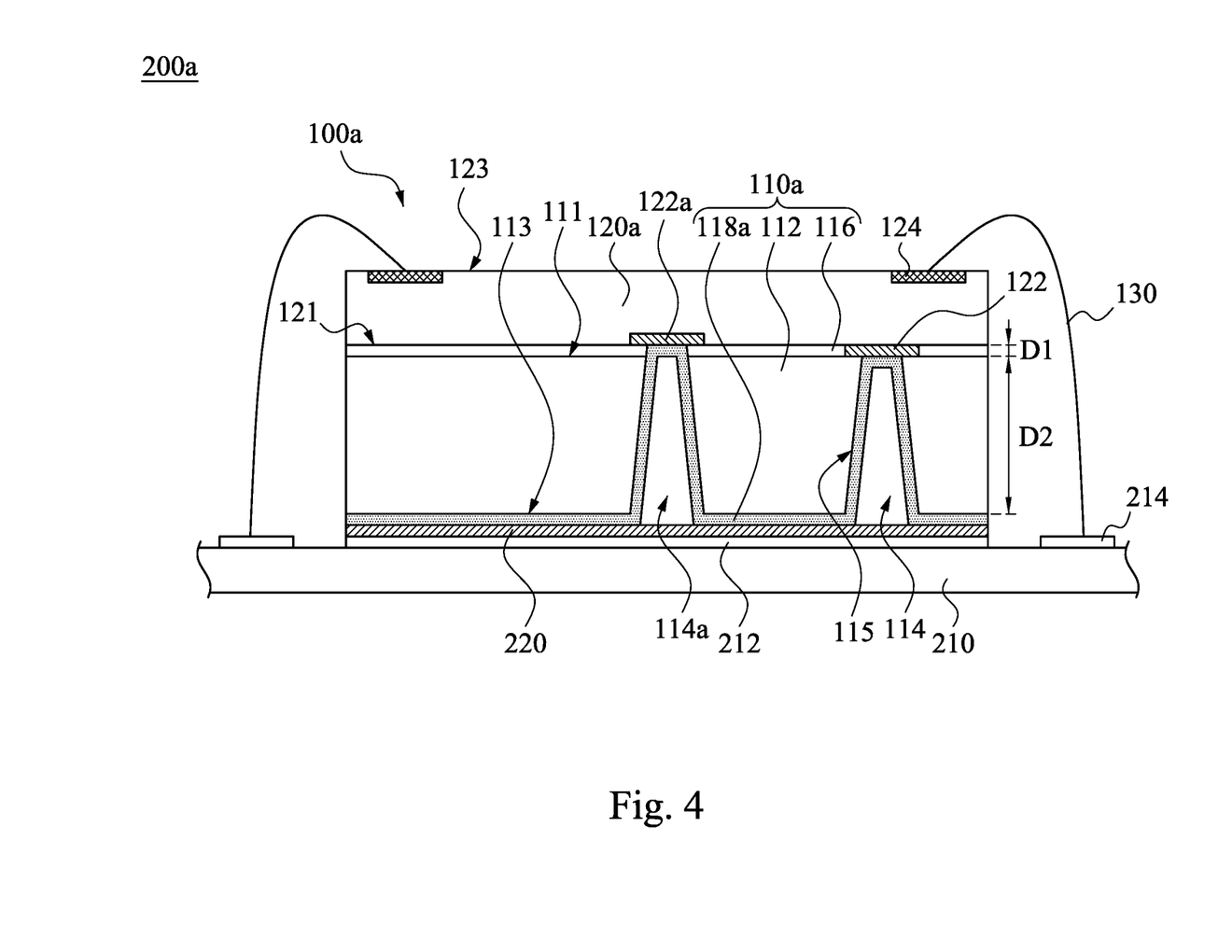
FIG. 4 is a cross-sectional view of a power module according to one embodiment of the present invention, in which the cross-sectional position is the same as FIG. 2.

FIG. 4 is a cross-sectional view of a power module 200a according to one embodiment of the present invention, in which the cross-sectional position is the same as FIG. 2. The power module 200a includes the printed circuit board 210 and a chip package 100a. The chip package 100a is located on the grounding region 212 of the printed circuit board 210. The chip package 100a includes a high voltage withstanding substrate 110a and a device chip 120a. The device chip 120a has the grounding pad 122, and further has a grounding pad 122a that is coplanar with the bottom surface 121. The difference between this embodiment and the embodiment of FIG. 2 is that the grounding pad 122a of the device chip 120a is located in the bottom surface 121 of the chip device 120a. In order to electrically connect the grounding layer 118a of the high voltage resistant substrate 110a to the ground pad 122a of the device chip 120a, the through hole 114a and the grounding layer 118a of the high voltage resistant substrate 110a further extend into the functional layer 116 to allow the grounding layer 118a may extend onto the grounding pad 122a. In this embodiment, the lower surface of the grounding pad 122a is higher than the lower surface of the grounding pad 122.

Figure 5:
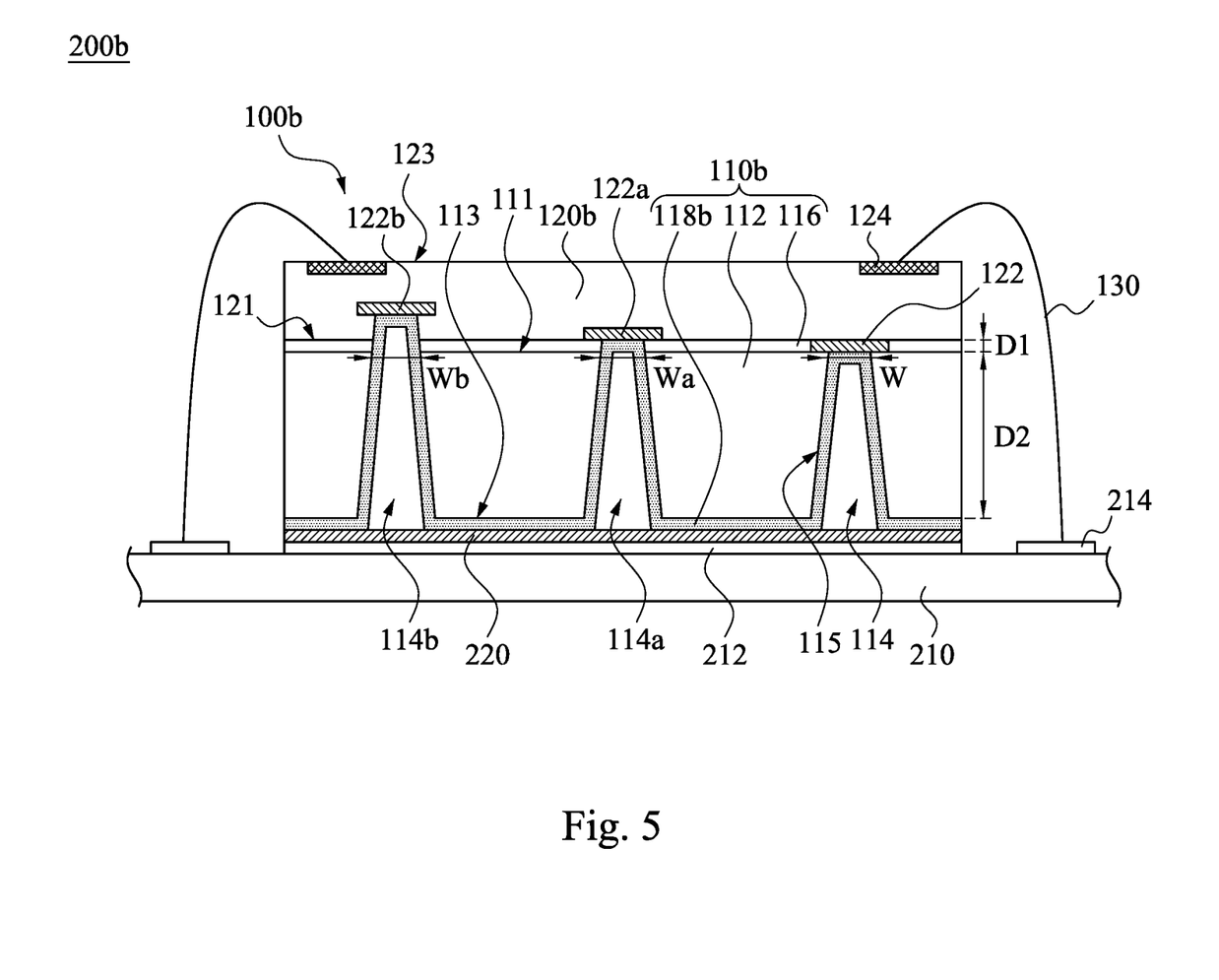
FIG. 5 is a cross-sectional view of a power module according to one embodiment of the present invention, in which the cross-sectional position is the same as FIG. 2.

FIG. 5 is a cross-sectional view of a power module 200b according to one embodiment of the present invention, in which the cross-sectional position is the same as FIG. 2. The power module 200b includes the printed circuit board 210 and a chip package 100b. The chip package 100b is located on the grounding region 212 of the printed circuit board 210. The chip package 100b includes a high voltage withstanding substrate 110b and a device chip 120b. The device chip 120b has the grounding pad 122 and the grounding pad 122a, and further has a grounding pad 122b. The grounding pad 122a and the grounding pad 122b are located in the bottom surface 121 of the device chip 120b. The difference between this embodiment and the embodiment of FIG. 4 is that the position of the grounding pad 122b of the device chip 120b is higher than the position of the grounding pad 122a. That is, the grounding pad 122b is closer to the top surface 123 of the device chip 120b than the grounding pad 122a. In order to electrically connect the grounding layer 118b of the high voltage resistant substrate 110b to the ground pad 122b of the device chip 120b, the through hole 114b of the high voltage resistant substrate 110b and the grounding layer 118b further extend into the device chip 120b to allow the grounding layer 118b to extend onto the grounding pad 122b. In this embodiment, the lower surface of the grounding pad 122b is higher than the lower surface of the grounding pad 122a, and the lower surface of the grounding pad 122a is higher than the lower surface of the grounding pad 122.

Figure 6:
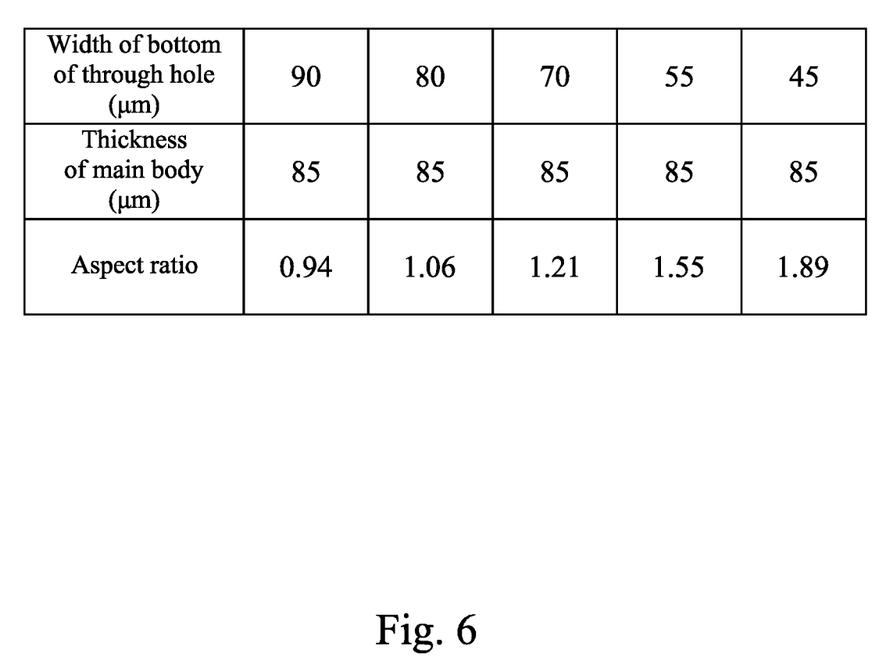
FIG. 6 is a data sheet related to aspect ratios of through holes shown in FIG. 5.

FIG. 6 is a data sheet related aspect ratios of the through holes 114, 114a, and 114b shown in FIG. 5. As shown in FIG. 5 and FIG. 6, in one embodiment, the thickness D2 of the main body 112 of the high voltage withstanding substrate 110b is about 85 μm, the width W of the bottom of the through hole 114 in the main body 112 is about 70 μm, the width Wa of the bottom of the through hole 114a in the main body 112 is about 55 μm, and the width Wb of the bottom of the through hole 114b in the main body 112 is about 45 μm, in which the widths W, Wa, and Wb are the bottom critical dimensions (BCD). After calculating, the aspect ratio of the through hole 114 in the main body 112 is about 1.21, the aspect ratio of the through hole 114a in the main body 112 is about 1.55, and the aspect ratio of the through hole 114b in the main body 112 is about 1.89. In other words, the power module 200b can utilize the through hole that extends into the functional layer 116 and/or the device chip 120b to adjust the aspect ratio of the through hole, without replacing the main body 112 with another main body having a different thickness, which is helpful in design.

Furthermore, the high voltage withstanding substrate 110b may further have two additional through holes (not shown), and the widths of the bottoms of the two through holes in the body 112 are respectively about 90 μm and 80 μm. After calculating, as shown in FIG. 6, the aspect ratios of the two through holes in the main body 112 are respectively about 0.94 and about 1.06.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
 a high voltage withstanding substrate having a main body, a functional layer and a grounding layer, the main body having a top surface and a bottom surface opposite the top surface, a through hole through the top surface and the bottom surface, and a sidewall surrounding the through hole, wherein the functional layer is made of a material comprising gallium nitride (GaN) and is located on the top surface, and the grounding layer covers the bottom surface and the sidewall; and a device chip located on the functional layer, and having a grounding pad that faces the main body, wherein the grounding pad is in contact with the functional layer and is electrically connected to the grounding layer in the through hole, and the grounding pad is further located in the functional layer.

2. The chip package of claim 1, wherein a thickness of the functional layer is in a range from 3 µm to 4 µm.

3. The chip package of claim 1, wherein the grounding layer substantially covers the entire bottom surface of the main body.

4. The chip package of claim 1, wherein a region of the grounding layer is greater than an area of the grounding pad.

5. The chip package of claim 1, wherein the grounding layer is made of a material comprising copper.

6. The chip package of claim 1, wherein the device chip has a bottom surface that faces the functional layer, and the grounding pad is located on the bottom surface of the device chip.

7. The chip package of claim 1, wherein the device chip has a bottom surface that faces the functional layer, and the grounding pad is located in the bottom surface of the device chip.

8. The chip package of claim 7, wherein the through hole and the grounding layer further extend into the functional layer.

9. The chip package of claim 8, wherein the through hole and the grounding layer further extend into the device chip.

10. The chip package of claim 1, wherein the device chip has a top surface facing away from the functional layer, and the top surface of the device chip has a conductive pad.

11. A power module, comprising:
a printed circuit board having a grounding region; and
a chip package located on the grounding region of the printed circuit board, comprising:
a high voltage withstanding substrate having a main body, a functional layer, and a grounding layer, the main body having a top surface and a bottom surface opposite the top surface, a through hole through the top surface and the bottom surface, and a sidewall surrounding the through hole, wherein the functional layer is made of a material comprising gallium nitride (GaN) and is located on the top surface, the grounding layer covers the bottom surface and the sidewall, and the grounding layer is located on the grounding region of the printed circuit board and is electrically connected to the grounding region; and
a device chip located on the functional layer, and having a grounding pad facing the main body, wherein the grounding pad is in contact with the functional layer and is electrically connected to the grounding layer in the through hole, and the grounding pad is further located in the functional layer.

12. The power module of claim 11, wherein the printed circuit board has a wire bonding region, the device chip has a top surface facing away from the functional layer, the top surface of the device chip has a conductive pad, and the power module further comprises:
a conductive wire, wherein two ends of the conductive wire are respectively located on the wire bonding region and the conductive pad.

13. The power module of claim 11, further comprising:
a bonding conductive layer located between the grounding layer of the high voltage withstanding substrate and the grounding region of the printed circuit board.

14. The power module of claim 13, wherein the bonding conductive layer is silver paste or solder.

* * * * *